United States Patent
Tang et al.

(10) Patent No.: US 11,254,612 B2
(45) Date of Patent: Feb. 22, 2022

(54) METHOD OF PREPARING NANO-THIN FILM OF CEMENT HYDRATION PRODUCT

(71) Applicant: Wuhan University, Wuhan (CN)

(72) Inventors: Shengwen Tang, Wuhan (CN); Wei Zhou, Wuhan (CN); Zhen He, Wuhan (CN); Wenzhi Yu, Wuhan (CN); Hubao A, Wuhan (CN); Jingtao Chen, Wuhan (CN); Xiang Ji, Wuhan (CN); Xiaofei Xu, Wuhan (CN)

(73) Assignee: WUHAN UNIVERSITY, Wuhan (CN)

( * ) Notice: Subject to any disclaimer, the term of this patent is extended or adjusted under 35 U.S.C. 154(b) by 112 days.

(21) Appl. No.: 16/857,156

(22) Filed: Apr. 23, 2020

(65) Prior Publication Data
US 2021/0122674 A1    Apr. 29, 2021

(30) Foreign Application Priority Data

Oct. 23, 2019  (CN) .......................... 201911012370.6

(51) Int. Cl.
| | |
|---|---|
| C04B 7/34 | (2006.01) |
| C04B 41/00 | (2006.01) |
| C04B 41/48 | (2006.01) |
| C04B 41/63 | (2006.01) |
| C23C 14/08 | (2006.01) |
| C23C 14/35 | (2006.01) |

(52) U.S. Cl.
CPC .............. *C04B 7/34* (2013.01); *C04B 41/009* (2013.01); *C04B 41/483* (2013.01); *C04B 41/63* (2013.01); *C23C 14/081* (2013.01); *C23C 14/35* (2013.01)

(58) Field of Classification Search
CPC ..... C04B 41/009; C04B 41/483; C04B 41/63; C23C 14/081; C23C 14/35
See application file for complete search history.

(56) References Cited

PUBLICATIONS

Lu et al. Synthesis of freestanding single-crystal perovskite films and heterostructures by etching of sacrificial water-soluble layers, Nature Materials, vol. 15, Dec. 2016, pp. 1255-1260. (Year: 2016).*

Yu Miyamoto et al. Preparation of self-supporting Au thin films on perforated substrate by releasing from water-soluble sacrificial layer, Jpn. J. Appl. Phys., vol. 55, 2016, 07LE05 pp. 1-6. (Year: 2016).*

\* cited by examiner

*Primary Examiner* — Kelly M Gambetta
(74) *Attorney, Agent, or Firm* — Matthias Scholl P.C.; Matthias Scholl

(57) ABSTRACT

A method of preparing a cement hydration product nano-thin film, the method including: (1) preparing a cement hydration product; (2) preparing a water sacrificial layer film; (3) depositing the cement hydration product obtained in (1) on the surface of the water sacrificial layer film obtained in (2) to obtain a cement hydration product film; and (4) immersing the cement hydration product film in a saturated aqueous solution of calcium hydroxide to dissolve the water sacrificial layer film to obtain a nano-thin film of the cement hydration product.

11 Claims, 3 Drawing Sheets

METHOD OF PREPARING NANO-THIN FILM OF CEMENT HYDRATION PRODUCT

CROSS-REFERENCE TO RELATED APPLICATIONS

Pursuant to 35 U.S.C. § 119 and the Paris Convention Treaty, this application claims foreign priority to Chinese Patent Application No. 201911012370.6 filed Oct. 23, 2019, the contents of which, including any intervening amendments thereto, are incorporated herein by reference. Inquiries from the public to applicants or assignees concerning this document or the related applications should be directed to: Matthias Scholl P.C. Attn.: Dr. Matthias Scholl Esq., 245 First Street, 18th Floor, Cambridge, Mass. 02142.

BACKGROUND

The disclosure relates to the field of inorganic material technology, and more particularly to a preparation method of a nano-thin film of a cement hydration product.

When the cement clinker reacts with water, the cement hydrates will gradually cover on the surface of the unhydrated cement particles in a thin film (layer) form. The cement hydrates are mainly calcium silicate hydrate (C-S-H), ettringite (AFt) and mono-sulfoaluminate (AFm). These hydrate films with different forms exhibit different transportation characteristics and mechanical properties. Therefore, it is particularly important to prepare and analyze cement hydrates C-S-H, AFt and AFm in form of free-standing films at micro/nano scale.

The preparation of micro/nano films is an effective method to study the micro/nano properties of cement hydrates C-S-H, AFt and AFm. The commonly used preparation methods of micro/nano films include physical/chemical vapor deposition, solution coating, magnetron sputtering and thermal evaporation. The magnetron sputtering is a kind of physical vapor deposition methods, and it has been widely and successfully applied to thin film deposition. With the aid of this method, some materials (such metals, semiconductors, ferromagnetic materials, and insulating oxides, ceramics, polymers) that are prepared into targets can be fabricated into thin films. A compound film with desired components can be deposited when a multi-component target is utilized. The thermal evaporation method is also a well-developed technique for the fabrication of thin film. The raw material is heated and evaporated into a gaseous state by an electron beam or a resistance wire in a vacuum chamber, and the gaseous raw material is directly adhered to the substrate placed above the raw material. Compared with other preparation methods of micro/nano films, the thermal evaporation is generally carried out under high vacuum conditions, and thus, the film deposition rate and chemical purity are relatively high. The damages to the substrate caused by the thermal evaporation is small, and the film with the high quality is easy to be processed.

SUMMARY

The disclosure provides a preparation method of a cement hydration product nano-thin film.

Disclosed is a method of preparing a cement hydration product nano-thin film, the method comprising:
(1) preparing a cement hydration product;
(2) preparing a water sacrificial layer film;
(3) depositing the cement hydration product obtained in (1) on a surface of the water sacrificial layer film obtained in (2) to obtain a cement hydration product film; and
(4) immersing the cement hydration product film in a saturated aqueous solution of calcium hydroxide to dissolve the water sacrificial layer film to obtain a nano-thin film of the cement hydration product.

The cement hydration product is calcium silicate hydrate (C-S-H), ettringite (AFt) or mono-sulfoaluminate (AFm).

The calcium silicate hydrate (C-S-H) is prepared by sol-gel method using calcium nitrate, sodium silicate and sodium hydroxide as raw materials, or by hydrothermal reaction at 200° C. using quicklime and quartz sand as raw materials; the ettringite (AFt) is prepared by tricalcium aluminate hydration reaction; and AFm is prepared by using tricalcium aluminate and gypsum.

The calcium silicate hydrate (C-S-H) has a chemical formula of $(CaO)_x \cdot SiO_2 \cdot nH_2O$, where x ranges from 0.5 to 3.0; a chemical formula of AFt is $3CaO \cdot Al_2O_3 \cdot 3CaSO_4 \cdot nH_2O$, where n ranges from 30 to 32; and a chemical formula of AFm is $3CaO \cdot Al_2O_3 \cdot CaSO_4 \cdot mH_2O$, where m is 8, 10, 12, 14 and 16.

Preparing a cement hydration product comprises treating a cement hydrate under vacuum at a temperature of 60° C. for 25 days, cooling down the cement hydrate at room temperature, grinding the cement hydrate into powders and putting in a mold, adding absolute ethanol to the powders according to a solid-liquid ratio of (10-13) g:(5-6) mL, and pressing a mixture of the powders and the absolute ethanol at a pressure of 280 megapascal to yield the cement hydration product with a diameter of 60 mm and a thickness of 4-5 mm.

The water sacrificial layer film is a strontium aluminate (SAO) film, a potassium chloride (KCl) film or a sodium chloride (NaCl) film.

The strontium aluminate (SAO) film is prepared by magnetron sputtering as follows:
preparing strontium aluminate by sol-gel method and grinding the strontium aluminate into powders;
putting the powders in a mold; adding absolute ethanol to the powders according to a solid-liquid ratio of (25-28) g:(7-8) mL; pressing mixture of the powders and the absolute ethanol at a pressure of 400-600 megapascal to yield a SAO target with a diameter of 60 mm and a thickness of 4-6 mm, calcining the target at 700-1300° C. for 8-12 h;
placing a glass substrate on a sample stage of a magnetron sputtering apparatus; placing the SAO target on a magnetron target position, and adjusting a distance between the glass substrate and the SAO target to be 2-10 cm, vacuuming a chamber of the magnetron sputtering apparatus to a pressure not lower than $1 \times 10^{-3}$ Pa, introducing argon gas into the chamber, controlling a flow rate of inert gas to be 10-100 sccm, and controlling the pressure of the chamber to be 0.5-2.5 Pa, setting a sputtering output power as 50-250 W, adjusting a reverse sputtering power to be less than 0.2-1 W, and setting a pre-sputtering time as 5-10 min, starting a sample stage rotation system to rotate the glass substrate at a constant speed, and depositing SAO target onto a surface of the substrate for 100-400 min to obtain a SAO film with a thickness of 80-200 nm.

The NaCl or KCl film is prepared by a thermal evaporation as follows: placing 0.5-1 g of NaCl or KCl solid in a tungsten evaporation boat, and adjusting a gas pressure of a vapor deposition chamber of the tungsten evaporation boat to be 1-5×10$^{-4}$ Pa; rotating a substrate at a constant speed; adjusting an evaporation power to control a growth rate of a NaCl or KCl film at 0.5-1 nm/s, and maintaining a temperature of the substrate at room temperature, monitoring a thickness of the NaCl or KCl film by a thickness meter to obtain a NaCl or KCl film with a thickness of 80-200 nm.

The cement hydration product film is prepared by magnetron sputtering as follows: placing a glass substrate with the water sacrificial layer film on a sample stage of a magnetron sputtering apparatus; placing the cement hydration product on a magnetron target position, and adjusting a distance between the glass substrate and the cement hydration product to be 2-10 cm; vacuuming a chamber of the magnetron sputtering apparatus to a pressure not less than 1×10$^{-3}$ Pa; introducing argon gas the chamber, controlling a flow rate of an inert gas to be 10-100 sccm, and controlling the pressure of the chamber to be 0.5-2.5 Pa; setting a sputtering output power as 50-250 W adjusting a reverse sputtering power to be less than 0.2-1 W, and setting the pre-sputtering time as 5-10 min; starting a sample stage rotation system to rotate the glass substrate at a constant speed, and depositing the cement hydration product onto a surface of the glass substrate for 200-500 min to obtain a cement hydration product film.

(4) comprises: disposing an organic polymer material layer with a thickness of 0.1 to 1 µm on a surface of the cement hydration product film; attaching the organic polymer material layer to a carrier; immersing the cement hydration product film comprising the organic polymer material layer attached to the carrier in the saturated aqueous solution of calcium hydroxide until the water sacrificial layer thin is dissolved; immersing the cement hydration product film comprising the organic polymer material layer attached to the carrier and excluding the water sacrificial layer thin in an organic solvent until the organic polymer material is dissolved, and separating the cement hydration product film from the carrier to obtain the nano-thin film of the cement hydration product.

The carrier is a copper mesh or a carbon micro grid; the organic polymer material layer comprises polymethyl methacrylate (PMMA), and the organic solvent is acetone.

The advantages of the preparation method of a nano-thin film of a cement hydration product are as follows:

(1) The saturated solution of calcium hydroxide is alkaline and would not react with the cement hydration product film and destroy the cement hydration product film. (2) The saturated solution of calcium hydroxide contains only hydroxide and calcium ions, and will not contaminate the cement hydration product film. (3) Because of the saturated solution of calcium hydroxide, the calcium ions in the cement hydration product film would not dissolve and cause a change in the calcium-silicon ratio of the film. (4) If the cement hydration product film is directly placed in the saturated solution of calcium oxide, after the thin film is separated from the water sacrificial layer and the substrate falls in the solution, the thin film of the cement hydration product has a small thickness, and the visibility in the solution is low, so the film is difficult to find, by attaching the cement hydration product film to the carrier, after the water sacrifice layer and the substrate are immersed in a saturated solution of calcium hydroxide, the carrier with the cement hydration product film attached is placed in an acetone solution, after the PMMA is dissolved, the cement hydration product film is carried on the carrier surface, which is easy to find. (5) Because of the volatile nature of acetone, after this step, it will not contaminate the film.

The method according to embodiments of the disclosure exhibits several advantages. The size and thickness of the nano-thin film of the cement hydration product can be controlled by adjusting the sputtering parameters. This method has a simple preparation process and costs very little, the instruments and equipment it used are common. The cement hydration product nano-thin film prepared by the method can not only eliminate the adverse effect of the substrate on the micro-nano test of the cement hydration product film, but also not damage the micro-nano structure of the film, and the hydration product is self-supporting. The nano-film can be conveniently used in subsequent experiments, such as morphological observation and testing of micro-mechanical properties.

DETAILED DESCRIPTION OF THE EMBODIMENTS

Figure 1:
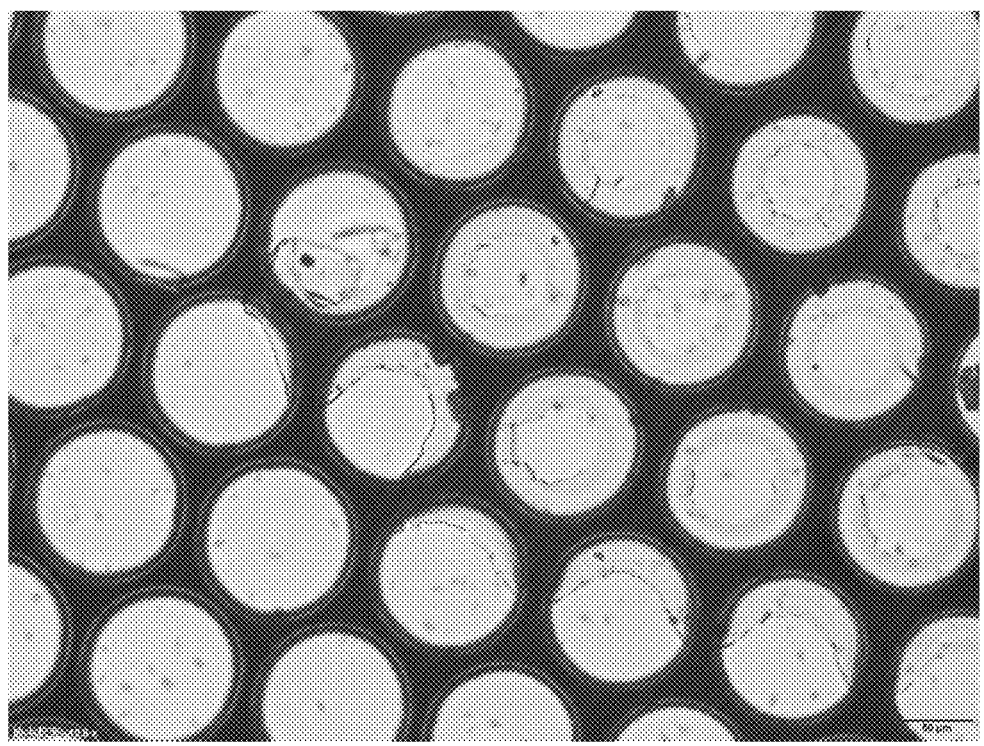
FIG. 1 is an optical image of a C-S-H nano-thin film with a calcium-silicon ratio of 1.0 prepared in Example 1 on a copper mesh.
Figure 2:
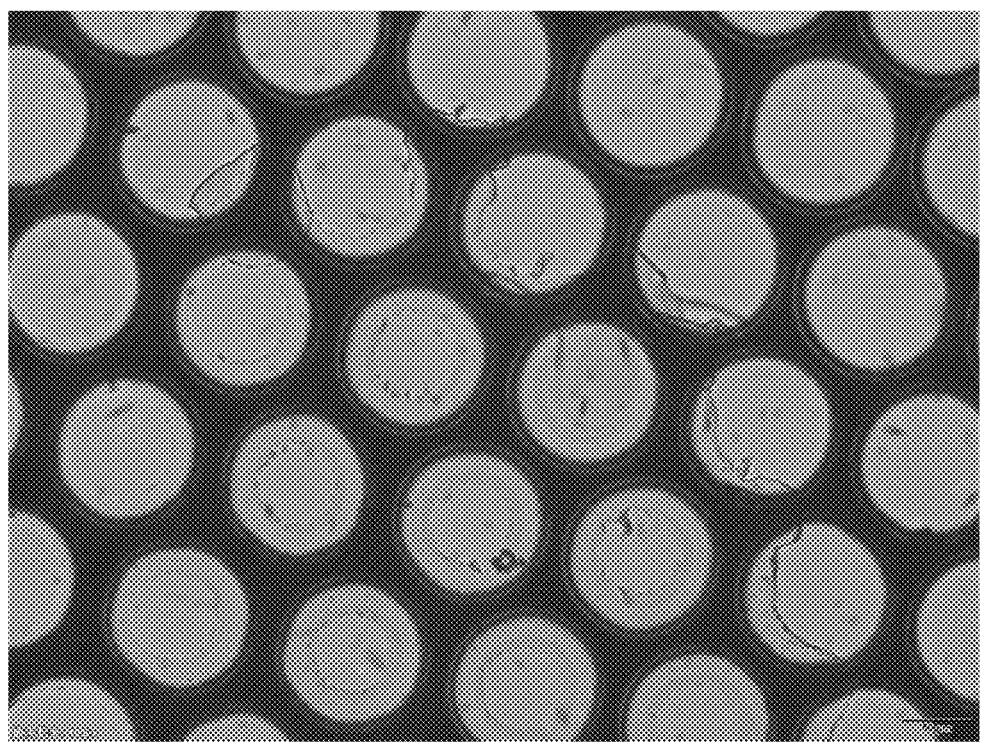
FIG. 2 is an optical image of a C-S-H nano-thin film with a calcium-silicon ratio of 1.5 prepared in Example 2 on a copper mesh.
Figure 3:
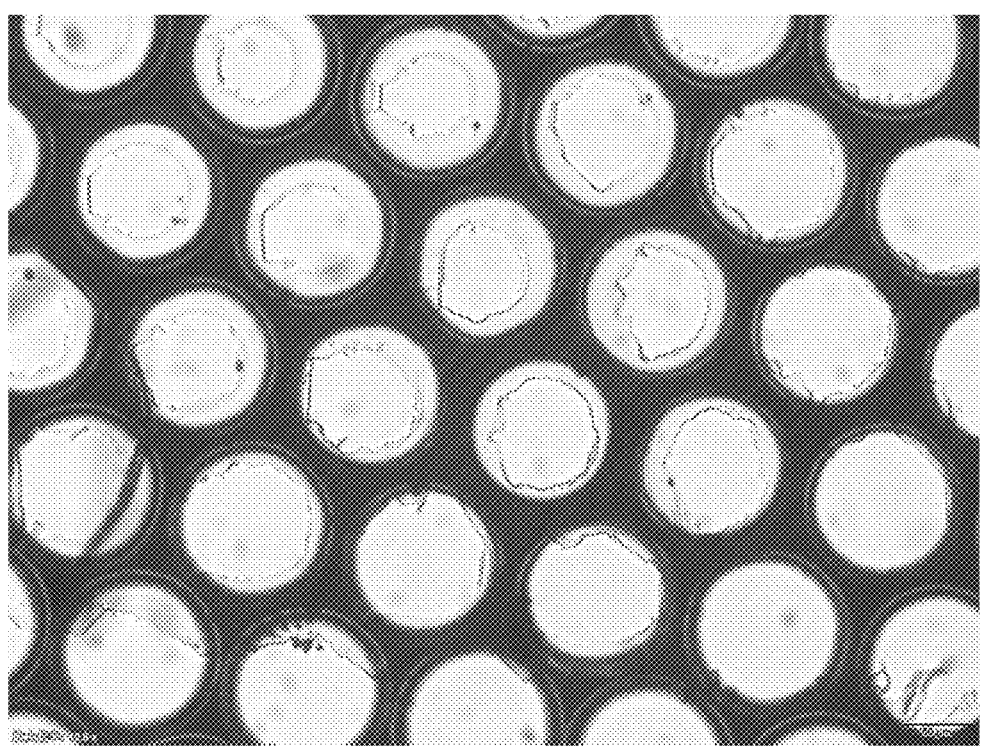
FIG. 3 is an optical image of a C-S-H nano-thin film with a calcium-silicon ratio of 2.0 prepared in Example 3 on a copper mesh.

To further illustrate, embodiments detailing a preparation method of nano-thin film of a cement hydration product are described below. It should be noted that the following embodiments are intended to describe and not to limit the disclosure.

Example 1

In this embodiment, a preparation method of C-S-H in the form of nano-thin film. C-S-H has a calcium-to-silicate ratio of 1.0, and the "water sacrificial" material is SAO. The preparation process is carried out as follows:

(1) Synthesis of C-S-H powders with a calcium-to-silicate ratio of 1.0;

(2) The synthetic C-S-H is stored wider vacuum at 60° C. for 25 days;

(3) 13 grams of C-S-H is taken out, ground into powders, mixed with absolute ethanol with 2 mL and pressed at a pressure of 270 megapascal to obtain a target with diameter of 60 mm and thickness of 4 mm;

(4) SAO is prepared by sol-gel method, ground into powders, mixed with absolute ethanol with 6 mL and pressed at a pressure of 540 megapascal to obtain a target with diameter of 60 mm and thickness of 4 mm;

(5) The glass substrate is placed on the sample stage of the magnetron sputtering apparatus, the SAO target is placed on the magnetron target position, and the distance between the substrate and the target is adjusted to be 3 cm;

(6) Vacuuming the chamber to control pressure as 5×10$^{-4}$ Pa;

(7) Argon gas is introduced into the chamber, the flow rate of the inert gas is controlled to be 20 sccm, and the pressure of the chamber is controlled to be 2 Pa;

(8) Start up the sputtering power, set the sputtering output power as 100 W, adjust the reverse sputtering power to less than 0.4 W, and the pre-sputtering time is about 8 min;

(9) Start the sample stage rotation system to rotate the substrate at a constant speed, and start depositing onto the surface of the substrate. The sputtering time is 300 min. A SAO film is obtained;

(10) Take out the SAO target, place the C-S-H target on the magnetron target position, adjust the distance between the substrate and the target to be 3 cm. Repeat Steps (6)-(8).

(11) Start the sample stage rotation system to rotate the substrate at a constant speed, and start depositing onto the surface of the SAO film. The sputtering time is 480 min. A substrate deposited two kinds of film is obtained;

(12) Place such substrate in 11) onto the spinning coater. The high temperature melted (100° C. and 2 min) PMMA solution is dropwise added to C-S-H layer by the pipette. The rotation speed and time of spinning coater are set as 4000 rpm/min and 1 min, respectively. Therefore, a film of PMMA with a thickness of 200 nm is coated onto the surface of C-S-H layer.

(13) The top surface of the organic polymer material in 12) is adhered to the TEM copper mesh, and immersed into the saturated calcium hydroxide solution for 2 days. Finally, the SAO is dissolved.

(14) The TEM copper mesh of the adhesive film treated in 13) is placed in acetone for 12 hours. The PMMA is removed to obtain a C-S-H free-standing nano film with a calcium-to-silicate ratio of 1.0.

Example 2

In this embodiment, a preparation method of C-S-H in the form of free-standing nano-thin film. C-S-H has a calcium-to-silicate ratio of 1.5, and the water sacrificial material is SAO. The preparation process is carried out as follows:

(1) Synthesis of C-S-H powders with a calcium-to-silicate ratio of 1.5;

(2) The synthetic C-S-H is stored under vacuum at 50° C. for 30 days;

(3) 13.5 grams of C-S-H is taken out, ground into powders, mixed with absolute ethanol with 3 mL and pressed at a pressure of 290 megapascal to obtain a target with diameter of 60 mm and thickness of 4 mm;

(4) SAO is prepared by sol-gel method, ground into powders, mixed with absolute ethanol with 6 mL and pressed at a pressure of 540 megapascal to obtain a target with diameter of 60 mm and thickness of 4 mm;

(5) The glass substrate is placed on the sample stage of the magnetron sputtering apparatus, the SAO target is placed on the magnetron target position, and the distance between the substrate and the target is adjusted to be 3 cm;

(6) Vacuuming the chamber to control pressure as $5\times10^{-4}$ Pa;

(7) Argon gas is introduced into the chamber, the flow rate of the inert gas is controlled to be 20 sccm, and the pressure of the chamber is controlled to be 2 Pa;

(8) Start up the sputtering power, set the sputtering output power as 100 W, adjust the reverse sputtering power to less than 0.4 W, and the pre-sputtering time is about 8 min;

(9) Start the sample stage rotation system to rotate the substrate at a constant speed, and start depositing onto the surface of the substrate. The sputtering time is 300 min. A SAO film is obtained;

(10) Take out the SAO target, place the C-S-H target on the magnetron target position, adjust the distance between the substrate and the target to be 3 cm. Repeat Steps (6)-(8).

(11) Start the sample stage rotation system to rotate the substrate at a constant speed, and start depositing onto the surface of the SAO film. The sputtering time is 480 min. A substrate deposited two kinds of film is obtained;

(12) Place such substrate in 11) onto the spinning coater. The high temperature melted (100° C. and 2 min) PMMA solution is dropwise added to C-S-H layer by the pipette. The rotation speed and time of spinning coater are set as 4000 rpm/min and 1 min, respectively. Therefore, a film of PMMA with a thickness of 200 nm is coated onto the surface of C-S-H layer.

(13) The top surface of the organic polymer material in 12) is adhered to the TEM copper mesh, and immersed into the saturated calcium hydroxide solution for 2 days. Finally, the SAO is dissolved.

(14) The TEM copper mesh of the adhesive film treated in 13) is placed in acetone for 12 hours. The PMMA is removed to obtain a C-S-H free-standing nano film with a calcium-to-silicate ratio of 1.5.

Example 3

In this embodiment, a preparation method of C-S-H in the form of free-standing nano-thin film. C-S-H has a calcium-to-silicate ratio of 2.0, and the water sacrificial material is SAO. The preparation process is carried out as follows:

(1) Synthesis of C-S-H powders with a calcium-to-silicate ratio of 2.0;

(2) The synthetic C-S-H is stored under vacuum at 60° C. for 28 days;

(3) 14 grams of C-S-H is taken out, ground into powders, mixed with absolute ethanol with 3.5 mL and pressed at a pressure of 300 megapascal to obtain a target with diameter of 60 mm and thickness of 4 mm;

(4) SAO is prepared by sol-gel method, ground into powders, mixed with absolute ethanol with 6 mL and pressed at a pressure of 540 megapascal to obtain a target with diameter of 60 mm and thickness of 4 mm;

(5) The glass substrate is placed on the sample stage of the magnetron sputtering apparatus, the SAO target is placed on the magnetron target position, and the distance between the substrate and the target is adjusted to be 3 cm;

(6) Vacuuming the chamber to control pressure as $5\times10^{-4}$ Pa;

(7) Argon gas is introduced into the chamber, the flow rate of the inert gas is controlled to be 20 sccm, and the pressure of the chamber is controlled to be 2 Pa;

(8) The sputtering power is turned on, the sputtering output power is set as 100 W, the reverse sputtering power is adjusted to be less than 0.4 W, and the pre-sputtering time is about 8 min;

(9) The sample stage rotation system is performed to rotate the substrate at a constant speed, and SAO target is deposited onto the surface of the substrate for sputter time of 300 min to obtain a SAO film;

(10) The SAO target is removed from the magnetron target position, and the C-S-H target is placed on the magnetron target position, the distance between the substrate and the target is adjusted to be 3 cm. Steps (6)-(8) are repeated once again;

(11) The sample stage rotation system is performed to rotate the substrate at a constant speed, and the C-S-H target is disposed onto the surface of the SAO film for sputter time of 480 min to obtain a substrate coated with two kinds of films;

(12) Such a substrate in 11) is placed onto a support of the spinning coater. The PMMA solution that has been melted at high temperature (100° C. and 2 min) is dropwise added to C-S-H layer by the pipette. The rotation speed and time of spinning coater are set as 4000 rpm/min and 1 min, respectively. Therefore, a film of PMMA with a thickness of 200 nm is coated onto the surface of C-S-H layer.

(13) The top surface of the organic polymer material in 12) is adhered to the TEM copper mesh, and immersed into the saturated calcium hydroxide solution for 2 days until the SAO is dissolved.

(14) The TEM copper mesh of the adhesive film treated in 13) is placed in acetone for 12 h. The PMMA is removed to obtain a C-S-H free-standing nano film with a calcium-to-silicate ratio of 2.0.

It will be obvious to those skilled in the art that changes and modifications may be made, and therefore, the aim in the appended claims is to cover all such changes and modifications.

What is claimed is:

1. A method, comprising:
    (1) preparing a cement hydration product;
    (2) preparing a water-soluble sacrificial layer film;
    (3) depositing the cement hydration product obtained in (1) on a surface of the water-soluble sacrificial layer film obtained in (2) to obtain a cement hydration product film; and
    (4) immersing the cement hydration product film in a saturated aqueous solution of calcium hydroxide to dissolve the water-soluble sacrificial layer film, thereby obtaining a nano-thin film of the cement hydration product.

2. The method of claim 1, wherein the cement hydration product is calcium silicate hydrate (C-S-H), ettringite (AFt) or mono-sulfoaluminate (AFm).

3. The method of claim 2, wherein the calcium silicate hydrate is prepared by sol-gel method using calcium nitrate, sodium silicate and sodium hydroxide as raw materials, or by hydrothermal reaction at 200° C. using quicklime and quartz sand as raw materials; the ettringite (AFt) is prepared by tricalcium aluminate hydration reaction; and AFm is prepared by using tricalcium aluminate and gypsum.

4. The method of claim 2, wherein the calcium silicate hydrate (C-S-H) has a chemical formula of $(CaO)_x \cdot SiO_2 \cdot nH_2O$, where x ranges from 0.5 to 3.0; a chemical formula of AFt is $3CaO \cdot Al_2O_3 \cdot 3CaSO_4 \cdot nH_2O$, where n ranges from 30 to 32; and a chemical formula of AFm is $3CaO \cdot Al_2O_3 \cdot CaSO_4 \cdot mH_2O$, where m is 8, 10, 12, 14 and 16.

5. The method of claim 1, wherein preparing a cement hydration product comprises treating a cement hydrate under vacuum at a temperature of 60° C. for 25 days, cooling down the cement hydrate at room temperature, grinding the cement hydrate into powders and putting in a mold, adding absolute ethanol to the powders according to a solid-liquid ratio of (10-13) g:(5-6) mL, thereby yielding a paste-like mixture, and pressing the paste-like mixture at a pressure of 280 megapascal to yield the cement hydration product with a diameter of 60 mm and a thickness of 4-5 mm.

6. The method of claim 1, wherein the water-soluble sacrificial layer film is a strontium aluminate (SAO) film, a potassium chloride (KCl) film or a sodium chloride (NaCl) film.

7. The method of claim 6, wherein the strontium aluminate (SAO) film is prepared by magnetron sputtering as follows:
    preparing strontium aluminate by sol-gel method and grinding the strontium aluminate into powders;
    putting the powders in a mold; adding absolute ethanol to the powders according to a solid-liquid ratio of (25-28) g:(7-8) mL; pressing mixture of the powders and the absolute ethanol at a pressure of 400-600 megapascal to yield a SAO target with a diameter of 60 min and a thickness of 4-6 mm, calcining the target at 700-1300° C. for 8-12 h;
    placing a glass substrate on a sample stage of a magnetron sputtering apparatus; placing the SAO target on a magnetron target position, and adjusting a distance between the glass substrate and the SAO target to be 2-10 cm, vacuuming a chamber of the magnetron sputtering apparatus to a pressure not lower than $1 \times 10^{-3}$ Pa, introducing argon gas into the chamber, controlling a flow rate of inert gas to be 10-100 sccm, and controlling the pressure of the chamber to be 0.5-2.5 Pa, setting a sputtering output power as 50-250 W, adjusting a reverse sputtering power to be less than 0.2-1 W, and setting a pre-sputtering time as 5-10 min; starting a sample stage rotation system to rotate the glass substrate at a constant speed, and depositing SAO target onto a surface of the substrate for 100-400 min to obtain a SAO film with a thickness of 80-200 nm.

8. The method of claim 6, wherein the NaCl or KCl film is prepared by a thermal evaporation as follows: placing 0.5-1 g of NaCl or KCl solid in a tungsten evaporation boat, and adjusting a gas pressure of a vapor deposition chamber of the tungsten evaporation boat to be $1-5 \times 10^{-4}$ Pa; rotating a substrate at a constant speed; adjusting an evaporation power to control a growth rate of a NaCl or KCl film at 0.5-1 nm/s, and maintaining a temperature of the substrate at room temperature, monitoring a thickness of the NaCl or KCl film by a thickness meter to obtain a NaCl or KCl film with a thickness of 80-200 nm.

9. The method of claim 1, wherein the cement hydration product film is prepared by magnetron sputtering as follows: placing a glass substrate with the water-soluble sacrificial layer film on a sample stage of a magnetron sputtering apparatus; placing the cement hydration product on a magnetron target position, and adjusting a distance between the glass substrate and the cement hydration product to be 2-10 cm; vacuuming a chamber of the magnetron sputtering apparatus to a pressure not less than $1 \times 10^{-3}$ Pa; introducing argon gas the chamber, controlling a flow rate of an inert gas to be 10-100 sccm, and controlling the pressure of the chamber to be 0.5-2.5 Pa; setting a sputtering output power as 50-250 W, adjusting a reverse sputtering power to be less than 0.2-1 W, and setting the pre-sputtering time as 5-10 min; starting a sample stage rotation system to rotate the glass substrate at a constant speed, and depositing the cement hydration product onto a surface of the glass substrate for 200-500 min to obtain a cement hydration product film.

10. The method of claim 1, wherein (4) comprises: disposing an organic polymer material layer with a thickness of 0.1 to 1 μm on a surface of the cement hydration product film; attaching the organic polymer material layer to a carrier; immersing the cement hydration product film comprising the organic polymer material layer attached to the carrier in the saturated aqueous solution of calcium hydroxide until the water-soluble sacrificial layer film is dissolved; immersing the cement hydration product film comprising the organic polymer material layer attached to the carrier and excluding the water-soluble sacrificial layer film in an organic solvent until the organic polymer material is dissolved, and separating the cement hydration product film from the carrier to obtain the nano-thin film of the cement hydration product.

11. The method of claim 10, wherein the carrier is a copper mesh or a carbon micro grid; the organic polymer material layer comprises polymethyl methacrylate (PMMA), and the organic solvent is acetone.

* * * * *